United States Patent
Hong et al.

(10) Patent No.: US 6,235,576 B1
(45) Date of Patent: May 22, 2001

(54) METHOD FOR MANUFACTURING A CYLINDRICAL CAPACITOR

(75) Inventors: Gary Hong, Hsin-Chu; Anchor Chen, Pingtung, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/241,522

(22) Filed: Feb. 1, 1999

(30) Foreign Application Priority Data

Dec. 11, 1998 (TW) .................................................. 87120601

(51) Int. Cl.$^7$ ...................................................... H01L 21/20
(52) U.S. Cl. ............................................ 438/253; 438/396
(58) Field of Search ...................................... 438/253, 396

(56) References Cited

U.S. PATENT DOCUMENTS 5,447,881 * 9/1995 Ryou ..................................... 438/396

* cited by examiner

Primary Examiner—John F. Niebling
Assistant Examiner—Lynne A. Gurley
(74) Attorney, Agent, or Firm—Jiawei Huang; J.C. Patents

(57) ABSTRACT

A method for manufacturing a cylindrical capacitor on a substrate includes the steps of providing a semiconductor substrate having a first conductive layer thereon, and then forming an insulation layer over the first conductive layer. The insulation layer can be a silicon nitride layer. The insulation layer is patterned to leave a portion of the patterned insulation layer above the node contact region. Thereafter, spacers are formed on the sidewalls of the patterned insulation layer such that the spacers are formed from a material that differs from the insulation layer and the first conductive layer. Next, an etching operation is conducted using the patterned insulation layer and the spacers as a mask to remove a portion of the first conductive layer. After that, the patterned insulation layer is removed. Then, a second etching operation is carried out using the spacers as a mask so that some more material from the upper portion of the first conductive layer is removed. Ultimately, a cylindrical shape structure that serves as the lower electrode of a capacitor is formed. Finally, the spacers are removed, and then a dielectric layer and a second conductive layer are sequentially formed over the cylindrical lower electrode to complete the fabrication of a cylindrical capacitor.

18 Claims, 6 Drawing Sheets

METHOD FOR MANUFACTURING A CYLINDRICAL CAPACITOR

CROSS-REFERENCE TO RELATED APPLICATION

This application claims the priority benefit of Taiwan application serial no. 87120601.

BACKGROUND OF THE INVENTION

1. Field of Invention

The present invention relates to a method for manufacturing a capacitor on a semiconductor substrate. More particularly, the present invention relates to a method for manufacturing a cylindrical capacitor that utilizes oxide spacers as a hard mask in a polysilicon etching operation.

2. Description of Related Art

As the processing power of microprocessors continues to grow at an exponential rate, the amount of data that can be processed by software programs at any one time increases correspondingly. Hence, the need for high capacity memories is imminent. At present, dynamic random access memories (DRAMs) are extensively used because they have a high storage capacity. Since each DRAM unit is composed of just a transfer field effect transistor (transfer FET) and a storage capacitor, DRAM can have a very high level of integration.

When the storage capacity of a DRAM is at the one megabit range or lower, a simple two-dimensional or planar type of capacitor design can be used in a memory unit. However, when fabricating higher capacity DRAMs, the simple two-dimensional capacitor design cannot reach the desired level of integration. This is because the combined surface area of all the capacitors would be much greater than the available substrate area on a silicon wafer. Consequently, for memory having a storage capacity greater than 4 megabits, three-dimensional capacitors are often used. One common type of three-dimensional capacitor is known as the stacked type, and a cylindrical capacitor belongs to the stacked type of capacitor.

FIGS. 1A through 1E are schematic, cross-sectional views showing the progression of manufacturing steps according to the conventional method of producing the lower electrode of a cylindrical capacitor. First, as shown in FIG. 1A, a semiconductor substrate 10 having device structure such as a source/drain region 12 is provided. Thereafter, an insulation layer 14 is deposited over the semiconductor substrate 10, and then a node contact opening 16 is formed in the insulation layer. Subsequently, polysilicon material is deposited into the node contact opening 16 and over the insulation layer 14 to form a polysilicon layer 18. The node contact inside the node contact opening 16 connects electrically with the source/drain region 12. After that, a photolithographic operation is carried out to form a photoresist layer 20 over the polysilicon layer 18, and then the photoresist layer is patterned.

Next, as shown in FIG. 1B, a portion of the polysilicon layer 18 is etched away using the photoresist layer 20 as a mask. The amount of polysilicon to be removed can be controlled by adjusting the etching period. Ultimately, a protruding slab structure 22 is carved out of the polysilicon layer 18. Subsequently, the photoresist layer 20 is removed.

Next, an insulation layer is formed over the polysilicon layer 18 and the protruding slab 22 as shown in FIG. 1C. Thereafter, an anisotropic etching back operation is carried out to form spacers 24 on the sidewalls of the protruding slab 22.

Next, as shown in FIG. 1D, a portion of the polysilicon layer 18 is etched away with the spacers 24 serving as a mask. The amount of polysilicon to be removed can also be controlled by adjusting the etching period. Consequently, a cylindrical-shaped structure 18a having a central hollow is formed. In general, horns 25 are also formed at the upper corner regions next to interior sidewalls of the spacers 24.

Finally, as shown in FIG. 1E, a wet etching operation is carried out to remove the spacers 24 so that the cylindrical-shaped structure 18a remains. The cylindrical-shaped structure 18a serves as the lower electrode of a capacitor. Thereafter, a dielectric layer 26 is formed over the lower electrode 18a, and then a polysilicon layer 28 is formed over the dielectric layer 26 to complete the fabrication of a capacitor structure 29. The polysilicon layer 28 serves as the upper electrode of the capacitor.

In the aforementioned method of forming a lower electrode structure, horn structures 25 are easily formed on the upper edges of the cylindrical-shaped structure 18a. Sometimes the sharp horns 25 may break, and hence may become a source of contaminants when the substrate is immersed in an acid bath for forming the dielectric layer 26. On the other hand, even if the horn structures 25 are not broken off, the accumulation of charges there may lead to serious current leakage problems.

In light of the foregoing, there is a need to provide an improved method for manufacturing a cylindrical capacitor structure.

SUMMARY OF THE INVENTION

Accordingly, the purpose of the present invention is to provide a method for manufacturing a cylindrical capacitor on a substrate that utilizes oxide spacers as a mask when etching a polysilicon layer. The method is capable of eliminating unwanted horns that conventionally form on the upper corner regions of the lower electrode of a capacitor, thereby reducing current leakage problems. Moreover, the cylindrical capacitor has a higher effective coupling area so that a higher capacitance is obtained.

To achieve these and other advantages and in accordance with the purpose of the invention, as embodied and broadly described herein, the invention provides a method for manufacturing a cylindrical capacitor on a substrate. The method includes the steps of providing a semiconductor substrate that has a source/drain region thereon, and then forming a first insulation layer over the substrate. Thereafter, a node contact opening is formed in the first insulation layer, and then a first conductive layer that fills the node contact opening and covers the first insulation layer is formed. The first conductive layer inside the node contact opening forms a node contact that connects electrically with the source/drain region. A second insulation layer is formed over the first conductive layer, and then the second insulation layer is patterned such that the remaining second insulation layer covers the region above the node contact. Spacers are formed on the sidewalls of the patterned second insulation layer. The spacers are made from material that differs from the second insulation layer and the first conductive layer. Thereafter, an anisotropic etching operation is conducted using the patterned second insulation layer and the spacers as a mask to remove a portion of the first conductive layer. A protruding structure is carved out of the first conductive layer. The protruding structure is formed above the node contact opening as well. After that, the patterned second insulation layer is removed. Then, a second anisotropic etching operation is carried out using the spacers as a mask and the first insulation layer as an etch stop layer to remove a portion of the first conductive layer. A cylindrical structure that serves as the lower electrode of a capacitor is formed. The spacers are removed, and then a dielectric layer and a second conductive layer are sequentially formed over the cylindrical lower electrode to complete the fabrication of the cylindrical capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
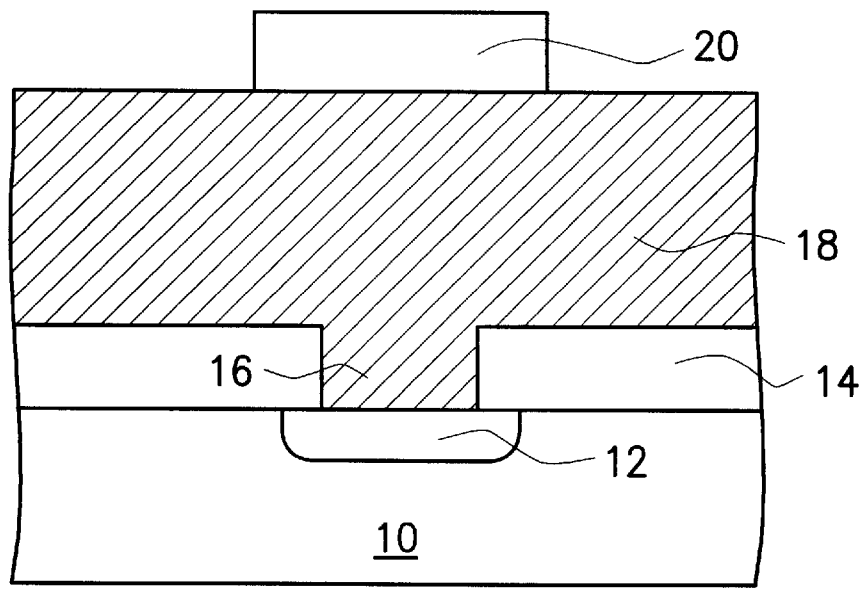
FIGS. 1A through 1E are schematic, cross-sectional views showing the progression of manufacturing steps according to the conventional method of producing the lower electrode of a cylindrical capacitor.
Figure 1B:
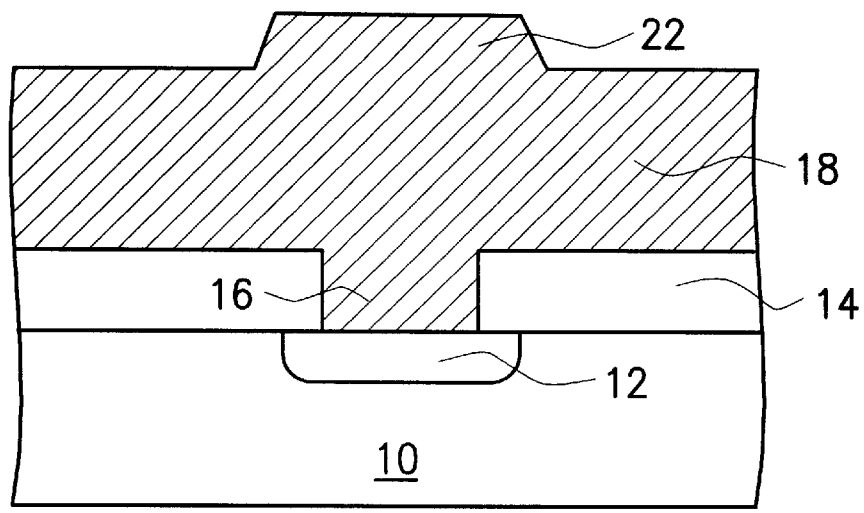
Figure 1C:
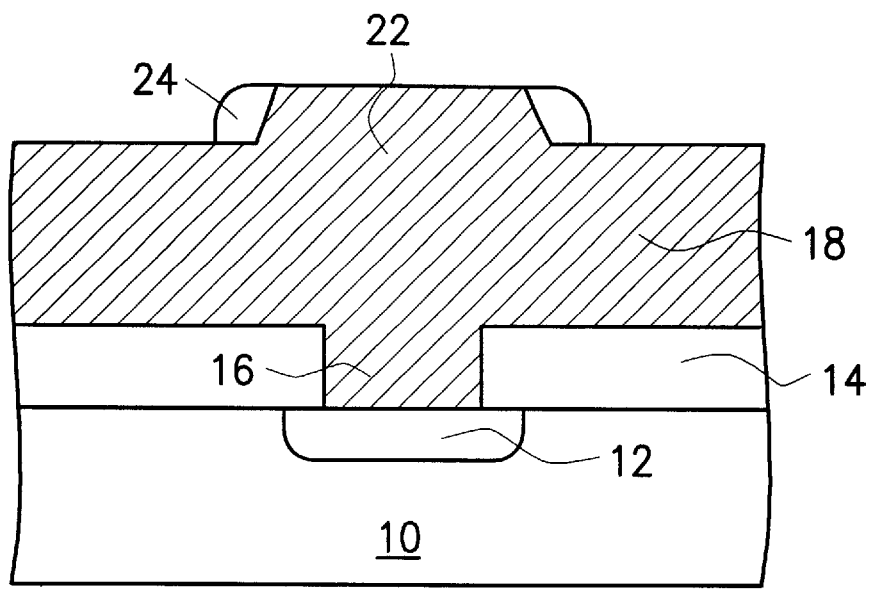
Figure 1D:
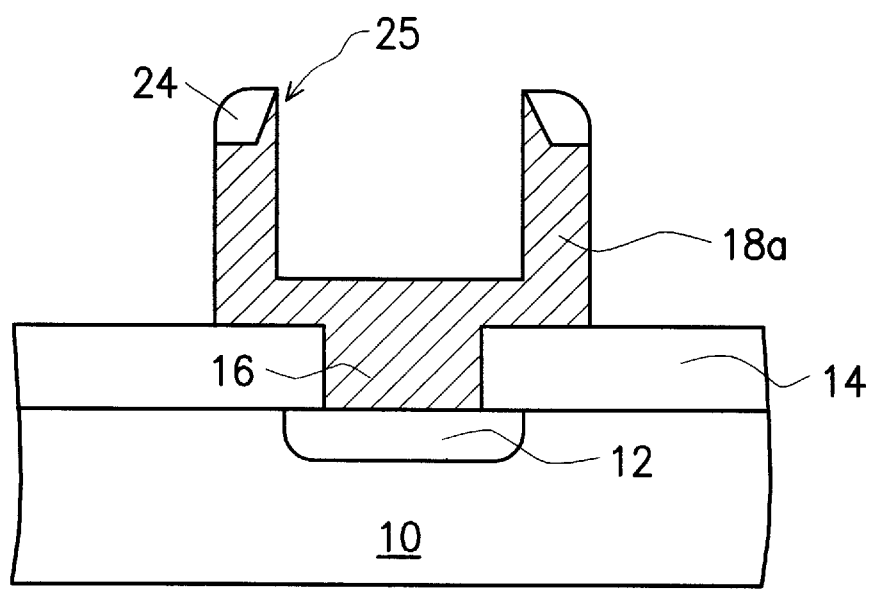
Figure 1E:
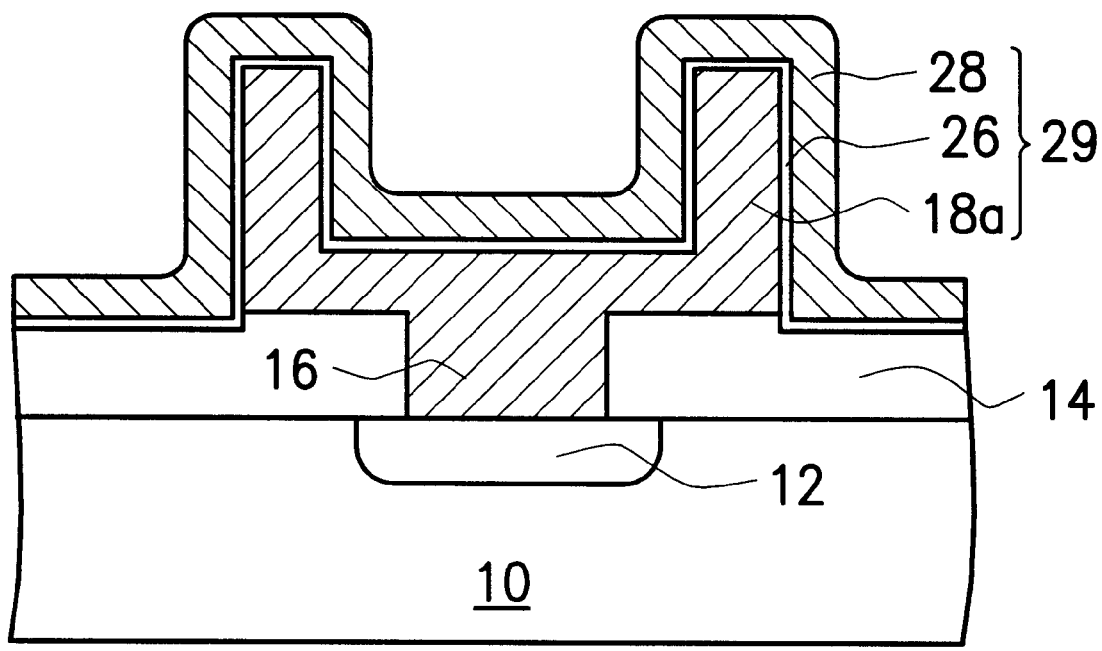

Reference will now be made in detail to the present preferred embodiments of the invention, examples of which are illustrated in the accompanying drawings. Wherever possible, the same reference numbers are used in the drawings and the description to refer to the same or like parts.

One major aspect of this invention is the provision of an improved method for manufacturing a cylindrical capacitor on a substrate. The method includes the steps of forming a patterned silicon nitride layer over a polysilicon layer, and then forming oxide spacers on the sidewalls of the patterned silicon nitride layer. Next, the oxide spacers are used as a hard mask to etch the polysilicon layer into a cylindrical lower electrode. This method is capable of eliminating unwanted horns that conventionally form on the upper corner regions of the lower electrode, thereby reducing current leakage. Moreover, the effective coupling area of a capacitor can be increased as well.

FIGS. 2A through 2G are schematic, cross-sectional views showing the progression of manufacturing steps for producing a cylindrical capacitor on a substrate according to the first preferred embodiment of this invention.

Figure 2A:
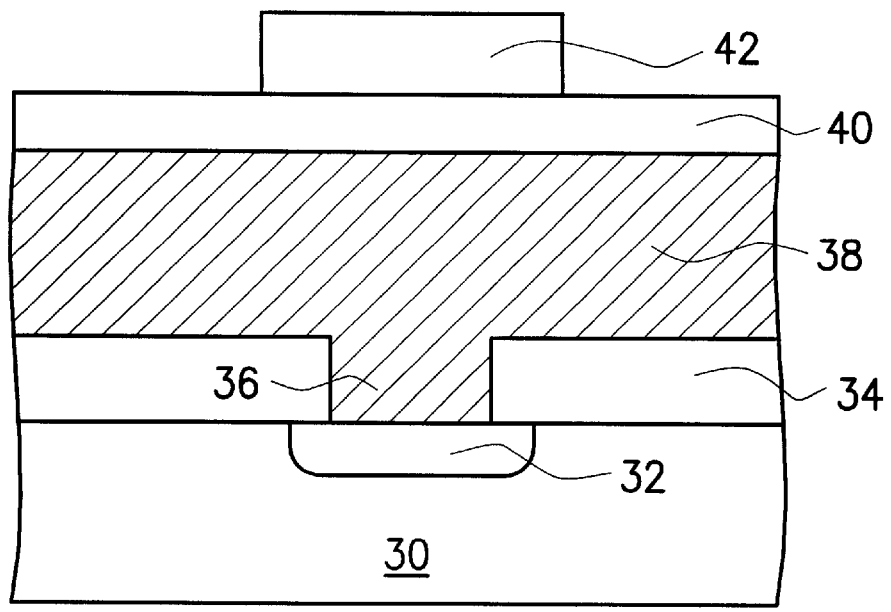
FIGS. 2A through 2G are schematic, cross-sectional views showing the progression of manufacturing steps for producing a cylindrical capacitor on a substrate according to one preferred embodiment of this invention.

As shown in FIG. 2A, a semiconductor substrate 30 having some device structure such as a source/drain region 32 thereon is provided. Thereafter, a first insulation layer 34, for example, a silicon oxide layer, is deposited over the substrate 30. Next, a node contact 36 that connects electrically with the source/drain region 32 is formed in the first insulation layer 34. Then, conductive material, preferably polysilicon, is deposited over the node contact 36 and the first insulation layer 34 to form a first conductive layer 38. Subsequently, insulating material, preferably silicon nitride is deposited over the first conductive layer 38 to form a second insulation layer 40. The second insulation layer 40 can be formed by performing a chemical vapor deposition (CVD) operation. Finally, a photolithographic operation is carried out to form a photoresist layer 42 over the second insulation layer 40.

Figure 2B:
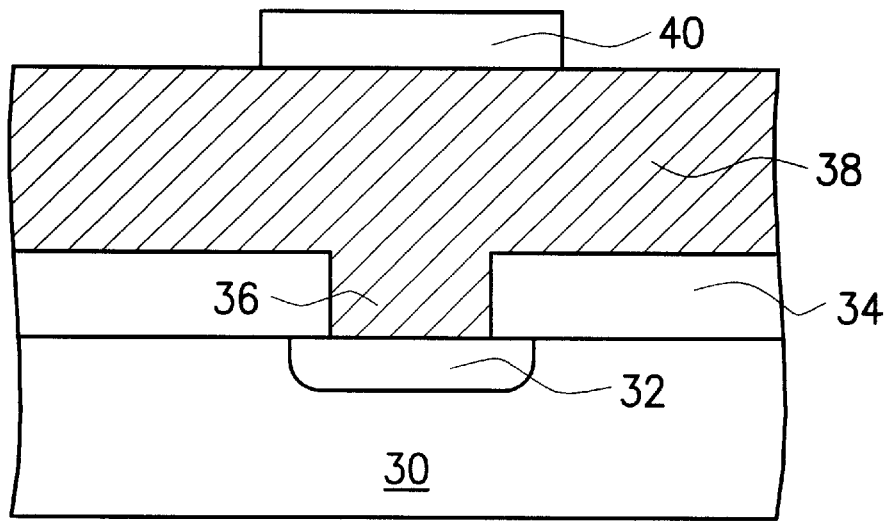

As shown in FIG. 2B, an anisotropic etching operation is carried out using the photoresist layer 42 as a mask and the first conductive layer 38 as an etching stop layer to pattern second the second insulation layer 40. The patterned insulation layer 40 is formed above the node contact 36. Thereafter, the photoresist layer 42 is removed.

Figure 2C:
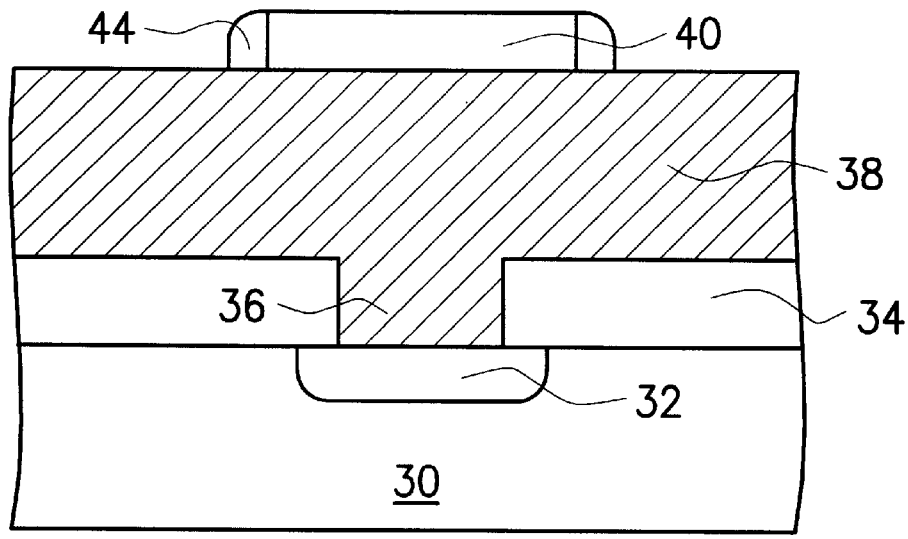

As shown in FIG. 2C, spacers 44 are formed on the sidewalls of the patterned second insulation layer 40. The spacers 44 can be formed by first carrying out a chemical vapor deposition (CVD) operation to form a silicon oxide layer over the patterned second insulation layer 40 and the first conductive layer 38. Then, an anisotropic etching operation is conducted to etch back the silicon oxide layer using the first conductive layer 38 as an etching stop layer.

Figure 2D:
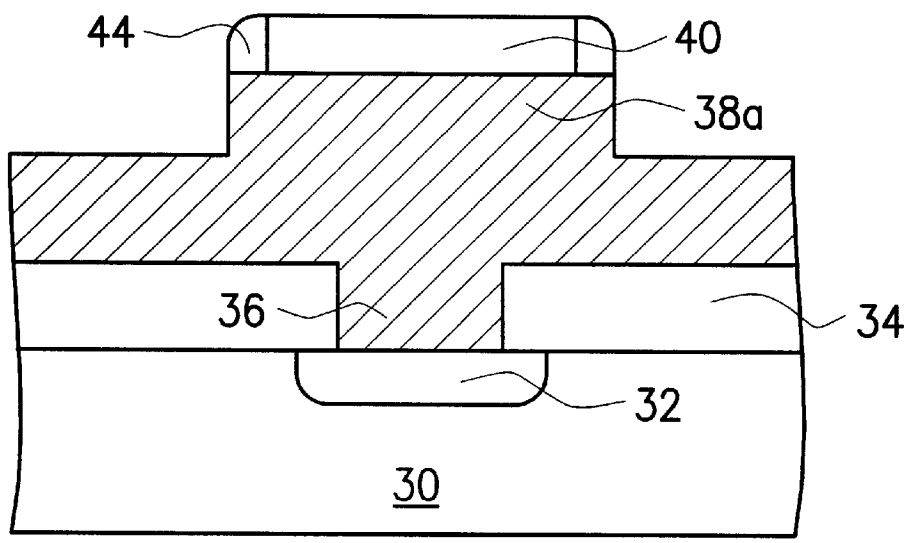

As shown in FIG. 2D, another anisotropic etching operation is carried out using the patterned second insulation layer 40 and the spacers 44 as a mask. Ultimately, a layer of the first conductive layer 38 is etched away to form a protruding slab 38a in the upper portion of the first conductive layer 38. The protruding slab 38a is formed above the node contact 36.

Figure 2E:
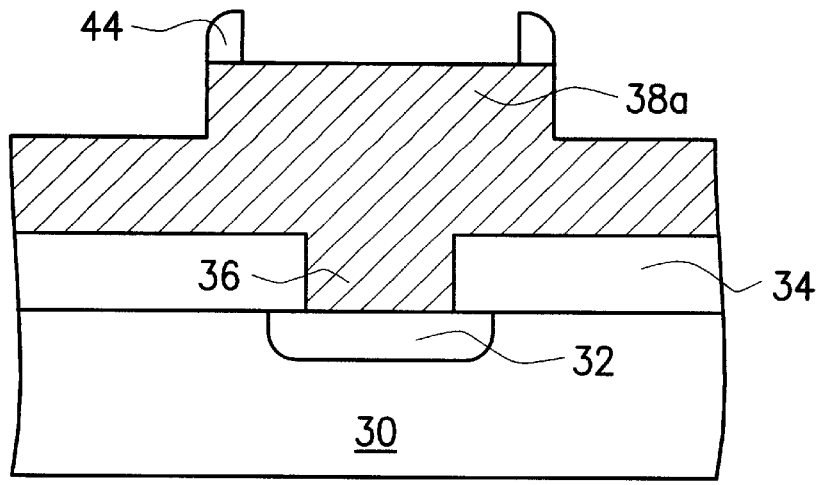

As shown in FIG. 2E, the patterned second insulation layer 40 is removed by performing a wet etching operation using an etching agent that has a high etching selectivity ratio.

Figure 2F:
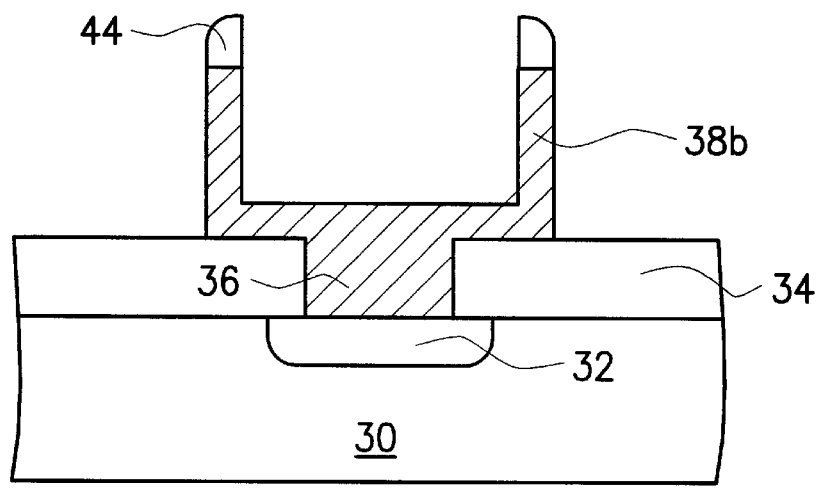

As shown in FIG. 2F, the conductive layer having a protruding slab 38a on top is etched using the spacers 44 as a mask and the first insulation layer 34 as an etching stop layer. Finally, a cylindrical structure having a central hollow 38b and spacers 44 on top is formed.

Figure 2G:
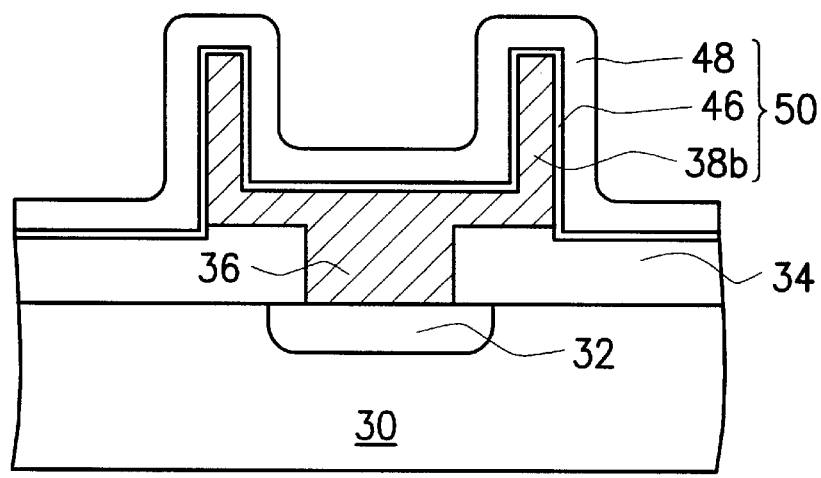

As shown in FIG. 2G, the spacers 44 are removed so that the structure 38b as shown in FIG. 2G forms the lower electrode of a capacitor. The spacers 44 can be removed by performing a wet etching operation using an etching agent that has a high etching selectivity ratio. Thereafter, a dielectric layer 46 is formed over the lower electrode 38b, and then a second conductive layer 48, preferably a polysilicon layer is formed over the dielectric layer 46. The second conductive layer 48 serves as the upper electrode of the capacitor. Hence, a complete capacitor 50 is fabricated.

In summary, major aspects of the method for manufacturing a cylindrical capacitor in this invention includes:

1. The manufacturing steps includes forming a patterned silicon nitride layer over a polysilicon layer, and then forming oxide spacers on the sidewalls of the patterned silicon nitride layer. Thereafter, a portion of the polysilicon layer is etched away using the oxide spacers a hard mask to form a cylindrical lower electrode.

2. The method can prevent unwanted horns from forming on the upper surface of the lower electrode, and hence is able to reduce current leakage from the capacitor. Furthermore, the effective coupling surface of a capacitor is also increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a cylindrical capacitor on a semiconductor substrate, comprising the steps of:

providing a semiconductor substrate having a source/drain region thereon;

forming a first insulation layer over the substrate;

forming a node contact in the first insulation layer such that the node contact connects electrically with the source/drain region;

forming a first conductive layer over the first insulation layer;

forming a second insulation layer over the first conductive layer, and then patterning the second insulation layer to retain a portion of the second insulation layer above the node contact;

forming spacers on the sidewalls of the patterned second insulation layer, wherein the spacers are formed from a material that differs from both the second insulation layer and the first conductive layer;

performing a first anisotropic etching operation using the patterned second insulation layer and the spacers as a mask to etch away a portion of the first conductive layer so that a protruding slab structure is carved out of the first conductive layer, wherein the protruding slab is located above the node contact;

removing the patterned second insulation layer to expose the protruding slab; then, as the next step after removing the patterned second insulation layer, performing a second anisotropic etching operation using the spacers as a mask and the first insulation layer as an etching stop layer to etch away a portion of the first conductive layer, thereby forming a cylindrical structure that serves as a lower electrode;

removing the spacers;

forming a dielectric layer over the cylindrical structure; and forming a second conductive layer over the dielectric layer, thereby forming a complete capacitor.

2. The method of claim 1, wherein the step of forming the second insulation layer includes depositing silicon nitride to form a silicon nitride layer.

3. The method of claim 1, wherein the step of forming the first conductive layer includes depositing polysilicon to form a polysilicon layer.

4. The method of claim 1, wherein the step of forming the spacers includes depositing silicon oxide to form oxide spacers.

5. The method of claim 1, wherein the step of forming the spacers includes forming a silicon oxide layer over the patterned second insulation layer and the first conductive layer by performing a chemical vapor deposition operation, and then performing an anisotropic etching operation to etch back the silicon oxide layer using the first conductive layer as an etching stop layer.

6. The method of claim 1, wherein the step of forming the dielectric layer further includes deposition a silicon oxide layer, a silicon nitride layer and then another silicon oxide layer in sequence to form an oxide/nitride/oxide (ONO) composite layer.

7. The method of claim 1, wherein the step of forming the second conductive layer includes deposition of polysilicon to form a polysilicon layer.

8. The method of claim 1, wherein the step of removing the patterned second insulation layer includes performing a wet etching operation using an etchant that has a high etching selectivity ratio.

9. The method of claim 1, wherein the step of removing the spacers includes performing a wet etching operation using an etchant that has a high etching selectivity ratio.

10. A method for manufacturing a cylindrical capacitor on a semiconductor substrate, comprising the steps of:

providing a semiconductor substrate having a source/drain region thereon;

forming a first insulation layer over the substrate;

forming a node contact in the first insulation layer such that the node contact connects electrically with the source/drain region;

forming a first conductive layer over the first insulation layer;

forming a second insulation layer over the first conductive layer, and then patterning the second insulation layer;

forming spacers on the sidewalls of the patterned second insulation layer;

performing a first etching operation using the patterned second insulation layer and the spacers as a mask to etch away a portion of the first conductive layer;

removing the patterned second insulation layer; then, as the next step after removing the patterned second insulation layer, performing a second etching operation using the spacers as a mask to etch away a portion of the first conductive layer, thereby forming a cylindrical structure that serves as a lower electrode;

removing the spacers; and forming a dielectric layer and a second conductive layer over the cylindrical structure in sequence to form a complete capacitor.

11. The method of claim 10, wherein the step of forming the second insulation layer includes depositing silicon nitride to form a silicon nitride layer.

12. The method of claim 10, wherein the step of forming the first conductive layer includes depositing polysilicon to form a polysilicon layer.

13. The method of claim 10, wherein the step of forming the spacers includes depositing silicon oxide to form oxide spacers.

14. The method of claim 10, wherein the step of forming the spacers includes forming a silicon oxide layer over the patterned second insulation layer and the first conductive layer by performing a chemical vapor deposition operation, and then performing an anisotropic etching operation to etch back the silicon oxide layer using the first conductive layer as an etching stop layer.

15. The method of claim 10, wherein the step of forming the dielectric layer further includes deposition of a silicon oxide layer, a silicon nitride layer and then another silicon oxide layer in sequence to form an oxide/nitride/oxide (ONO) composite layer.

16. The method of claim 10, wherein the step of forming the second conductive layer includes deposition of a polysilicon layer.

17. The method of claim 10, wherein the step of removing the patterned second insulation layer includes performing a wet etching operation using an etchant that has a high etching selectivity ratio.

18. The method of claim 10, wherein the step of removing the spacers includes performing a wet etching operation using an etchant that has a high etching selectivity ratio.

* * * * *